(12) United States Patent
Kwon et al.

(10) Patent No.: US 10,750,643 B2
(45) Date of Patent: Aug. 18, 2020

(54) AIRFLOW CHANNELING STRUCTURE FOR DENSELY PACKED STORAGE ENCLOSURES

(71) Applicant: DELL PRODUCTS, L.P., Round Rock, TX (US)

(72) Inventors: Haesung Kwon, Austin, TX (US); Austin Michael Shelnutt, Leander, TX (US); Walter Carver, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 442 days.

(21) Appl. No.: 15/640,698

(22) Filed: Jul. 3, 2017

(65) Prior Publication Data
US 2017/0303437 A1    Oct. 19, 2017

Related U.S. Application Data

(63) Continuation of application No. 14/612,434, filed on Feb. 3, 2015, now Pat. No. 9,723,758.

(51) Int. Cl.
*H05K 7/20* (2006.01)
*G11B 33/12* (2006.01)
*G11B 33/14* (2006.01)

(52) U.S. Cl.
CPC ....... *H05K 7/20727* (2013.01); *G11B 33/128* (2013.01); *G11B 33/142* (2013.01); *H05K 7/20145* (2013.01); *Y10T 29/4913* (2015.01)

(58) Field of Classification Search
CPC ........... H05K 7/20727; H05K 7/20145; G11B 33/128; G11B 33/142; Y10T 29/4913; Y10T 29/49124; Y10T 29/49117; Y10T 29/49002

USPC ................................ 29/832, 829, 825, 592.1
See application file for complete search history.

(56) References Cited

U.S. PATENT DOCUMENTS

| | | |
|---|---|---|
| 5,544,006 A | 8/1996 | Radloff et al. |
| 5,579,204 A | 11/1996 | Nelson et al. |
| 6,055,157 A | 4/2000 | Bartilson |
| 6,362,968 B1 | 3/2002 | Lajara et al. |
| 6,477,055 B1 | 11/2002 | Bolognia et al. |
| 7,088,583 B2 | 8/2006 | Brandon et al. |
| 7,298,607 B2 | 11/2007 | Zielnicki |
| 7,319,586 B2 | 1/2008 | Hall et al. |

(Continued)

*Primary Examiner* — Peter Dungba Vo
*Assistant Examiner* — Azm A Parvez
(74) *Attorney, Agent, or Firm* — Isidore PLLC

(57) ABSTRACT

A method of manufacturing a chassis that cools thermal energy generating components of an information handling system (IHS) includes: forming an enclosure with a chassis that has a base wall for provisioning a thermal energy generating component; forming one or more stiffeners each having one or more air channels formed transversely through for directing air proximate to the base wall; attaching the one or more stiffeners laterally across the base wall; and attaching a planar member that is horizontally on top of the one or more stiffeners for engaging one or more forward compute components on top of the planar member that substantially block air flow above the planar member to the thermal energy generating component. The one or more air channels eliminate thermal shadowing caused by thermal energy generating components provisioned in a rear area of the chassis.

14 Claims, 10 Drawing Sheets

(56) References Cited

U.S. PATENT DOCUMENTS

| | | | |
|---|---|---|---|
| 8,064,200 B1 * | 11/2011 | West | H05K 7/20563 |
| | | | 361/694 |
| 8,363,412 B2 * | 1/2013 | Budai | G06F 1/185 |
| | | | 165/104.33 |
| 2006/0118948 A1 | 6/2006 | Lin | |
| 2009/0116183 A1 | 5/2009 | Mundt | |
| 2009/0284907 A1 | 11/2009 | Regimbal et al. | |
| 2009/0296339 A1 | 12/2009 | Sun | |
| 2014/0084763 A1 | 3/2014 | Doglio et al. | |
| 2016/0150681 A1 | 5/2016 | Leigh et al. | |

* cited by examiner

AIRFLOW CHANNELING STRUCTURE FOR DENSELY PACKED STORAGE ENCLOSURES

RELATED APPLICATION

This application is a continuation of and claims priority from U.S. application Ser. No. 14/612,434, filed Feb. 3, 2015, the contents of which is fully incorporated herein by reference.

BACKGROUND

1. Technical Field

This disclosure generally relates to information handling systems (IHSs), and more particular to an IHS chassis having air flow directed to thermal energy generating components that are thermally shadowed by other compute components.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Ever-increasing demand for storage capacity of hard disk drives (HDD) and solid state drives (SSD) prompts system designers and end users to seek solutions that can fit higher storage capacity into smaller external volumes. Storage enclosures that hold more drives (e.g., HDDs) result in high system airflow impedance since the drives are tightly packed. The air flow impedance of enclosures is proportional to how much airflow is blocked by the HDD and its carrier. In these densely packed storage enclosures, the combination of pre-heated air from the HDDs and reduced airflow creates a challenge to cool thermally sensitive components that are downstream of the HDD array. Increasing fan power to achieve the same amount of airflow can mitigate these effects only to a certain degree.

BRIEF SUMMARY

The illustrative embodiments of the present disclosure provide structural support within a chassis for dense storage requirements while providing for robust thermal management. The weight of densely packed storage enclosures require that structure be added along a width direction of the enclosure in order to increase the stiffness of a base wall of the enclosure and minimize sag/sagging.

According to at least one aspect of the present disclosure, a chassis for an IHS is provided having a thermal energy generating component that is thermally shadowed by one or more compute components. In one embodiment, the chassis includes an enclosure having a base wall, an air intake at a front side, and an air exhaust at a rear side. One or more stiffeners are attached laterally across the base wall and positioned between the front side and a rear area of the base wall. A planar member is horizontally attached on top of the one or more stiffeners. The planar member is provisioned with the one or more compute components that substantially block air flow above the planar member to cause thermal shadowing of the thermal energy generating component that is provisioned in the rear area. One or more air channels are formed through each of the one or more stiffeners to direct air flow under the planar member toward the rear area that is provisioned with the thermal energy generating component.

According to at least one aspect of the present disclosure, an IHS includes the chassis, the one or more compute components, and the thermal generating component to form a functional server. The one or more air channels formed through each of the one or more stiffeners direct air flow under the planar member toward the thermal energy generating component. Thereby the chassis provides structural support to densely provisioned compute components on the planar member, which is in turn supported by the stiffeners having air channels for cooling.

According to at least one aspect of the present disclosure, a method is provided of manufacturing a chassis that cools thermal energy generating components of an IHS. In one embodiment, the method includes forming an enclosure with a chassis that has a base wall. The method includes forming one or more stiffeners each having one or more air channels formed transversely through. The method includes attaching the one or more stiffeners laterally across the base wall. The method includes attaching a planar member that is horizontally on top of the one or more stiffeners. The method includes provisioning a thermal energy generating component within the enclosure of the chassis to a rear of the planar member. The method includes engaging one or more forward compute components on top of the planar member, where the placement of the compute components blocks air flow above the planar member to the thermal energy generating component. The method includes providing an air flow directed towards the one or more air channels through each of the one or more stiffeners to direct air flow to the thermal energy generating component.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
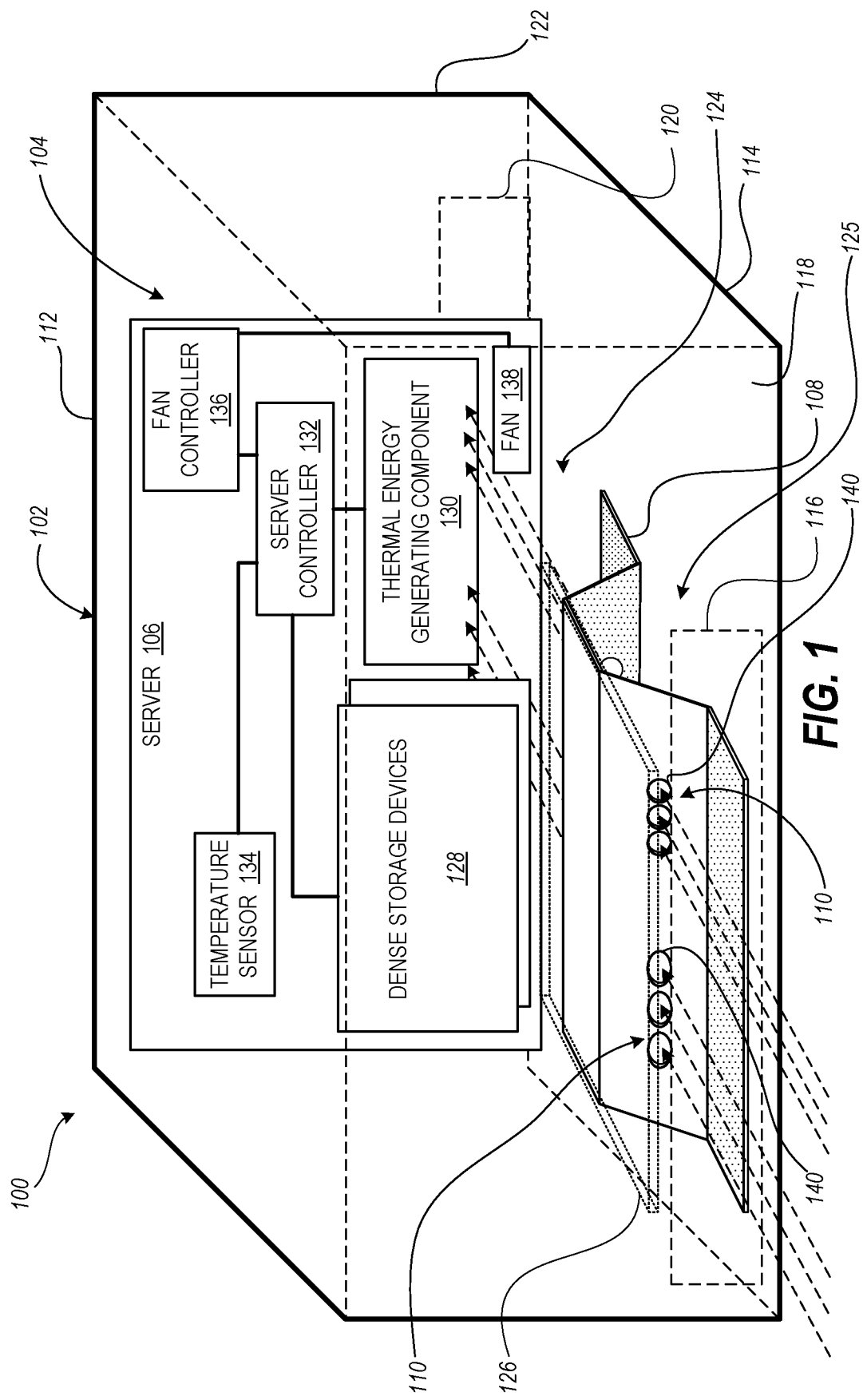
FIG. 1 illustrates a diagrammatic view of an information handling system (IHS) that controls cooling air through stiffeners of a chassis of a server, according to one or more embodiments.

The present disclosure provides an information handling system (IHS) having a server chassis fitted with one or more stiffeners that direct cooling air around compute components placed within the chassis. The chassis includes an enclosure having a base wall, an air intake at a front side, and an air exhaust at a rear side. A base stiffener provides the structure for the enclosure as part of a chassis that is provisioned with functional compute components of an information handling system (IHS). Stiffeners are attached laterally across the base wall and positioned between the front side and a rear area of the base wall. A planar member is horizontally attached on top of the one or more stiffeners. The planar member is provisioned with the compute components that substantially block air flow above the planar member to cause thermal shadowing of the thermal energy generating component that is provisioned in the rear area. Being perpendicular to the airflow direction, generally-known base stiffeners block airflow to downstream components.

In the present innovation, the base stiffener both stiffens the base wall and channels air to downstream components. Air channels formed through each of the stiffeners direct air flow under the planar member toward the rear area that is provisioned with the thermal energy generating component. The base stiffener is designed and/or fabricated to include notches or apertures through which air can move, while not significantly impacting the strength of the stiffener. Air channels formed through the base stiffener can provide two discrete benefits to a system cooling infrastructure. First, the base stiffener behaves as a snorkel for directing cooling air to downstream system components, such as central processing units (CPUs), dual in-line memory modules (DIMMs), and Peripheral Component Interconnect Express (PCIe) cards, which downstream components are located behind higher impedance system components, such as a dense array of hard disk drives (HDDs). Second, the stiffener can disrupt thermal shadowing along the base of the HDD backplane by allowing some preheated air to be remixed with fresh air being channeled through the stiffener. Since HDDs have biased thermal loads towards an interface connector where a voice coil motor (VCM) and systems-on-a-chip (SOC) are closely located, HDDs can be cooled more effectively when more air is introduced near the backplane as provided by the present disclosure.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 2:
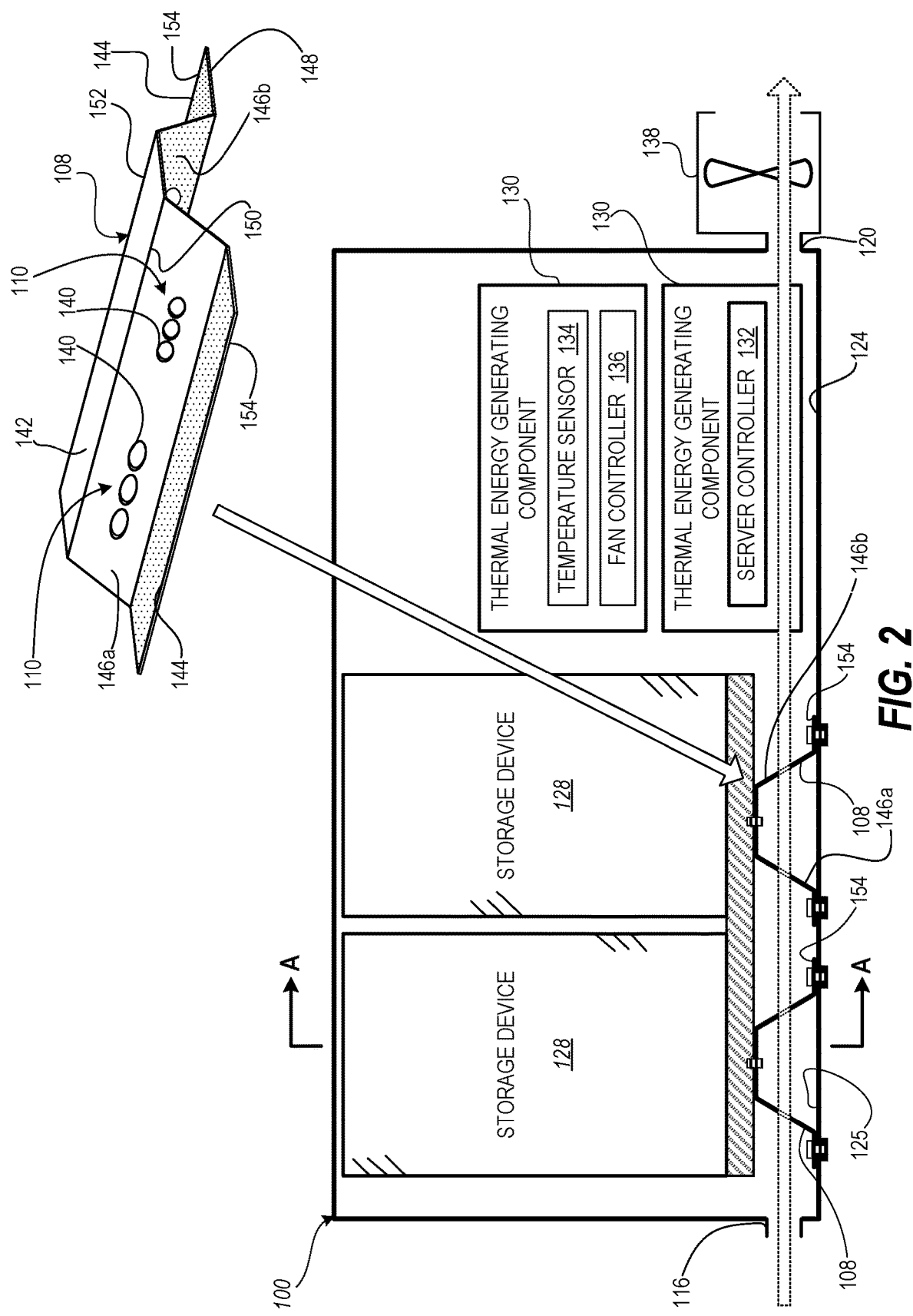
FIG. 2 illustrates a left side diagrammatic top view of the server of FIG. 1, according to one or more embodiments.
Figure 3:
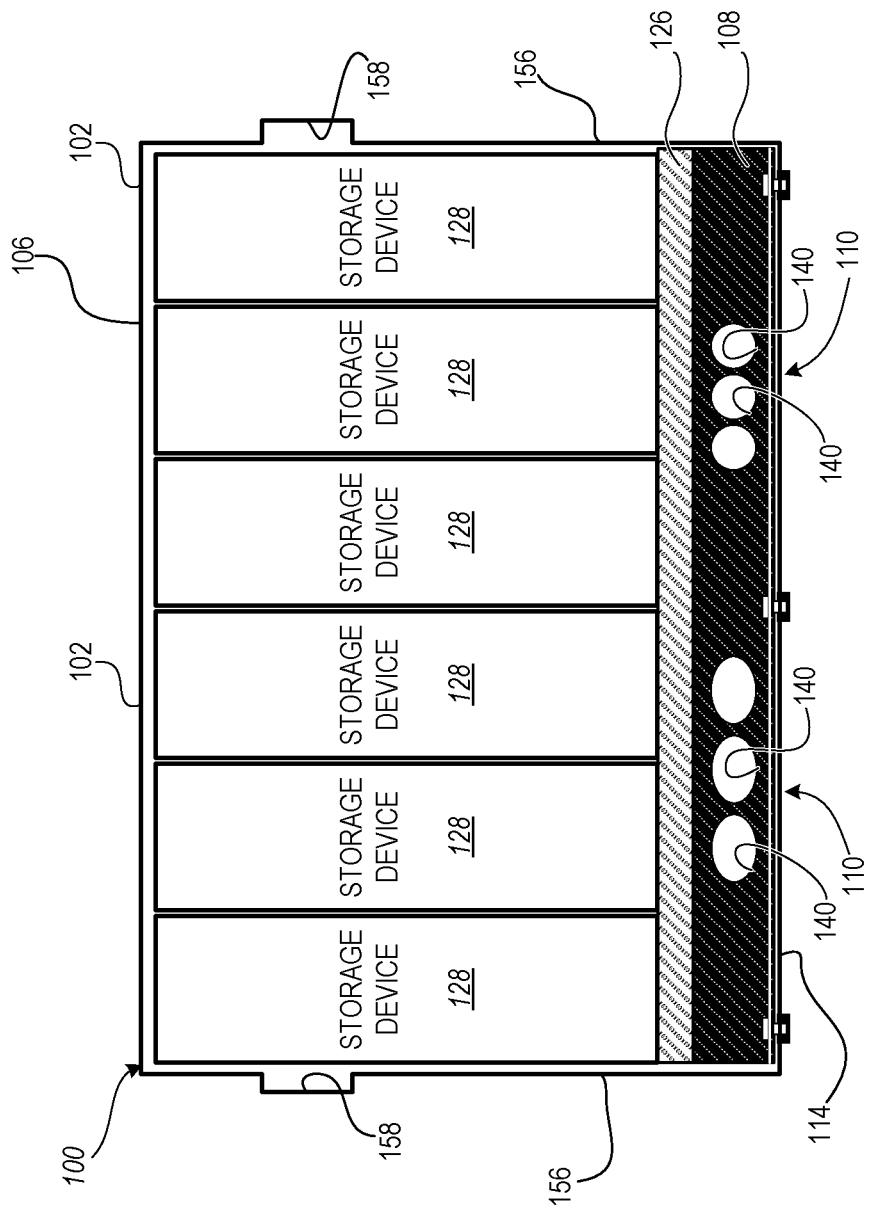
FIG. 3 illustrates a front side diagrammatic view of the IHS of FIG. 2 cutaway along lines A-A, according to one or more embodiments.

FIGS. 1-3 illustrate block diagram representations of an example IHS 100 having a server chassis 102 that houses functional compute components 104, which collectively form a functional server 106 that comprises or is a constituent portion of the IHS 100. A base stiffener 108 provides lateral structural stiffness to the server chassis 102 and also provides one or more air channels 110 for cooling certain compute components 104. The server 106 represents one of a plurality of various embodiments of the disclosure. For purposes of this disclosure, an information handling system, such as IHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

With continued reference to FIGS. 1-3, the server chassis 102 provides cooling air around functional compute components 104 of the IHS 100. The server chassis 102 includes an enclosure 112 having a base wall 114. The enclosure 112 has an air intake 116 at a front side 118. The enclosure 112 has an air exhaust 120 at a rear side 122. Base stiffeners 108 are attached laterally across the base wall 114 in a front area 125 that is positioned between the front side 118 and a rear area 124 of the base wall 114. A planar member 126 is horizontally attached on top of the one or more base stiffeners 108. The planar member 126 is provisioned with particular compute components 104, such as dense storage devices 128, that substantially block air flow above the planar member 126, causing thermal shadowing of thermal energy generating component/s 130 provisioned in the rear area 124. Air channels 110 formed through each of the stiffeners 108 direct air flow under the planar member 126 toward the rear area 124 provisioned with the thermal energy generating component/s 130.

A particular amount of air flow is required for cooling the thermal energy generating component/s 130 with the functioning IHS 100. A server controller 132 can monitor a temperature sensor 134 to detect an interior temperature within the enclosure 112. In response to the detected interior temperature, the server controller 132 can direct a fan controller 136 to change an operating speed of one or more fans 138 that push or pull air through the enclosure 112 from the air intake 116 to the air exhaust 120. The relative size and numbers of aperture/s 140 that form each air channel 110 can vary and thus each air channel 110 can have a different effective aperture to address cooling requirements of the thermal energy generating component/s 130.

With further reference to FIG. 2, in one embodiment the stiffener 108 can include a planar member supporting surface 142, a base wall contacting surface 144, and a blocking surface 146 that is connected between the planar member supporting surface 142 and the base wall contacting surface 144. The blocking surface 146 has a solid surface that would otherwise block airflow through the server chassis 102 under the planar member 126. However, apertures 140 formed within the solid surface of the blocking surface 146 provide one or more air channels 110 for directing cooling air along the base wall 114 (FIG. 1).

In an exemplary embodiment, the stiffener 108 is formed from a piece of sheet metal 148, which is bent to form two base supports (chassis contacting flanges 154), angled side walls (blocking surfaces 146), and an elevated, substantially horizontal, planar member supporting surface 142. The first blocking surface 146a is angled downward from a forward edge 150 of the elevated planar member supporting surface 142 the second blocking surface 146b is angled downward from a rearward edge 152 of the elevated planar member supporting surface 142. Each of the first and second blocking surfaces 146 flare horizontally and outwardly into a respective forward and rearward chassis contacting flanges 154 for attaching to the base wall 114 of the enclosure 112.

With further reference to FIG. 3, the enclosure 112 can further provide for lateral walls 156 that are each attached to respective sides of the base wall 114. Each lateral wall includes a recessed air channel 158 to direct air across the sides of one or more compute components, such as dense storage devices 128, provisioned proximate to the respective lateral wall 156. In one embodiment, the recessed air channel 158 is formed by stamping a contoured shape into sheet metal. The recessed air channel 158 can direct cooling air to a thermal energy generating component 130 that is provisioned in an elevated portion of the enclosure 112 (FIG. 1).

Figure 4:
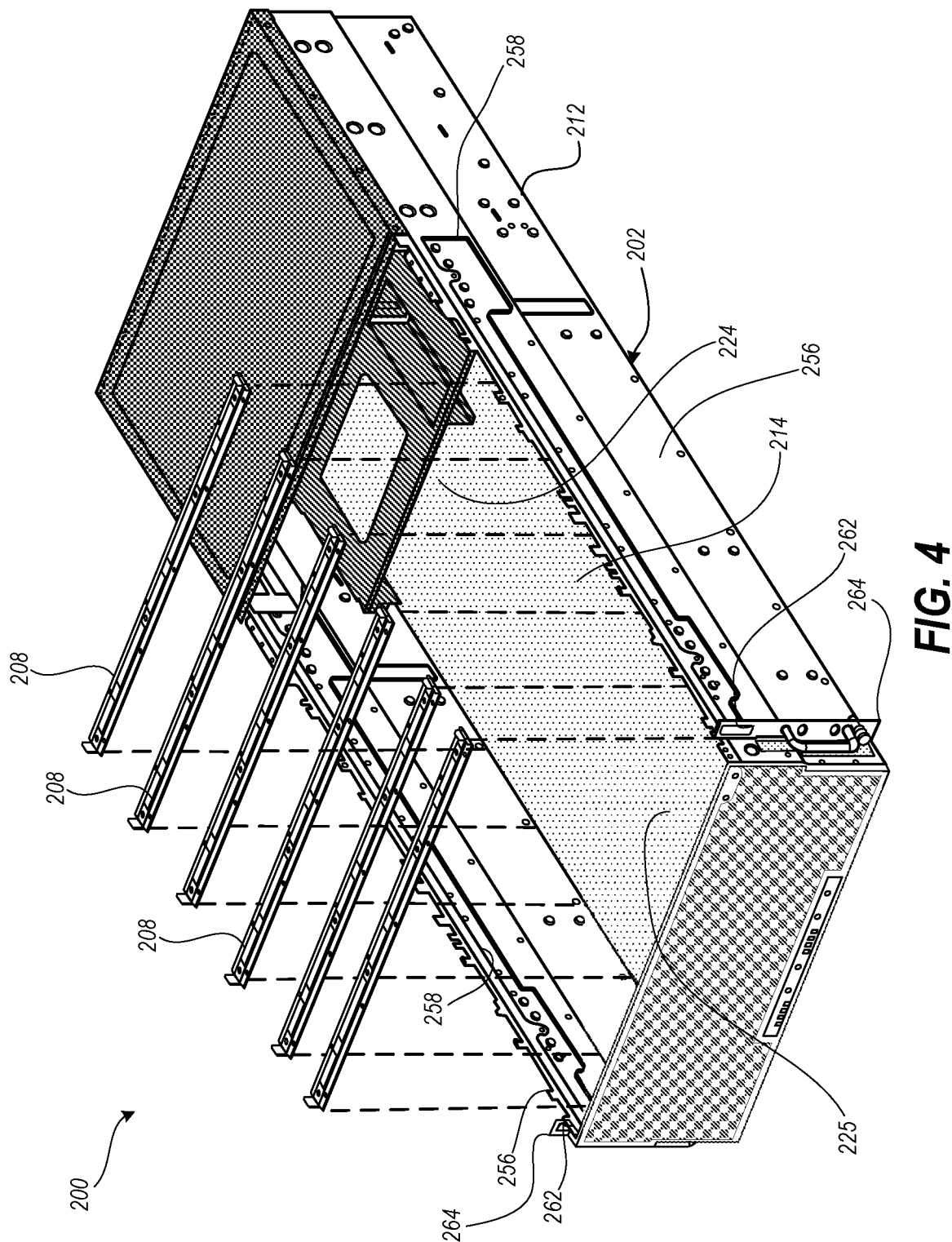
FIG. 4 illustrates a front left perspective view of an example chassis for the IHS of FIG. 2 with example stiffeners disassembled, according to one or more embodiments.
Figure 5:
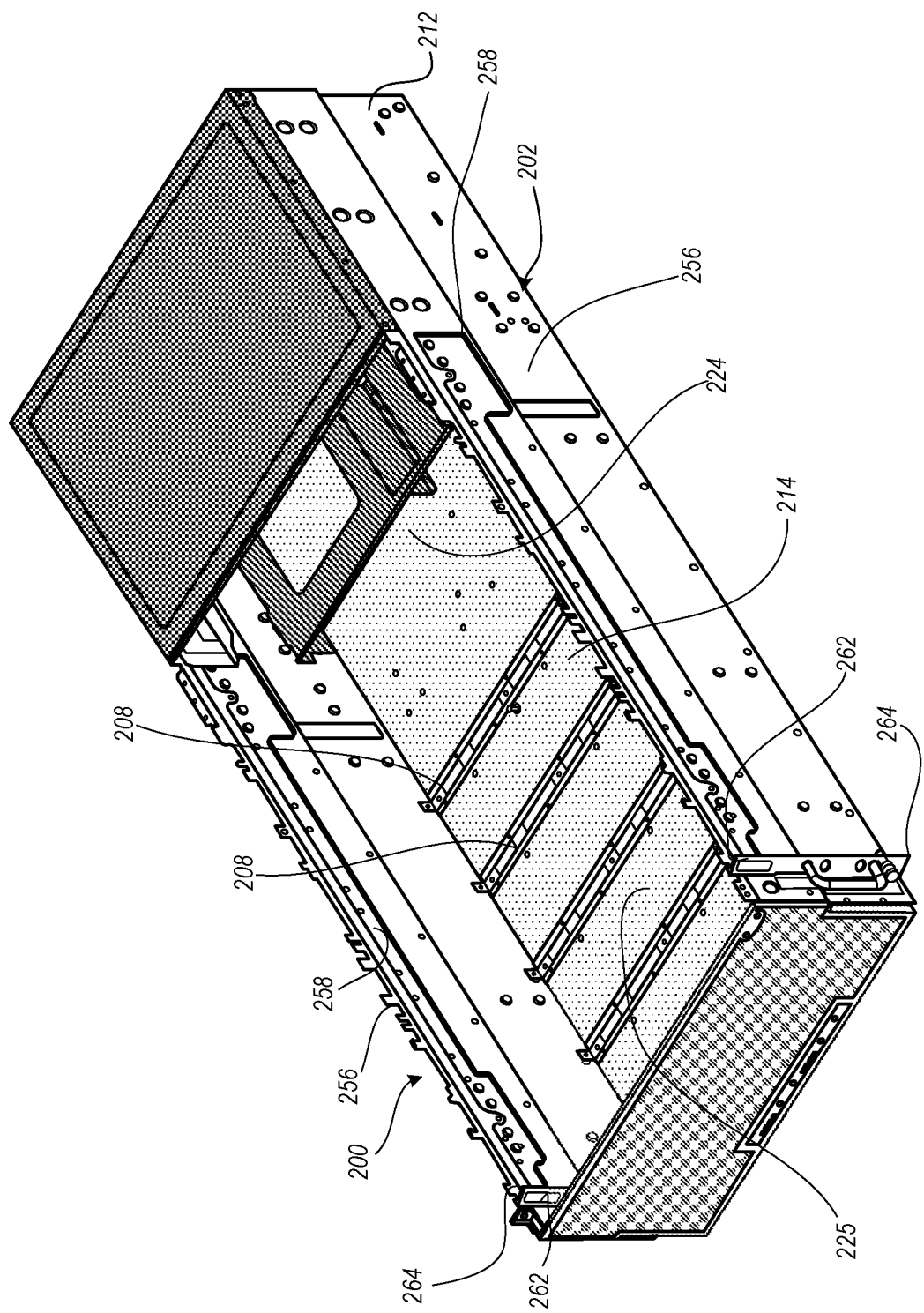
FIG. 5 illustrates a front left perspective view of the chassis of FIG. 4 with the example stiffeners assembled, according to one or more embodiments.
Figure 6:
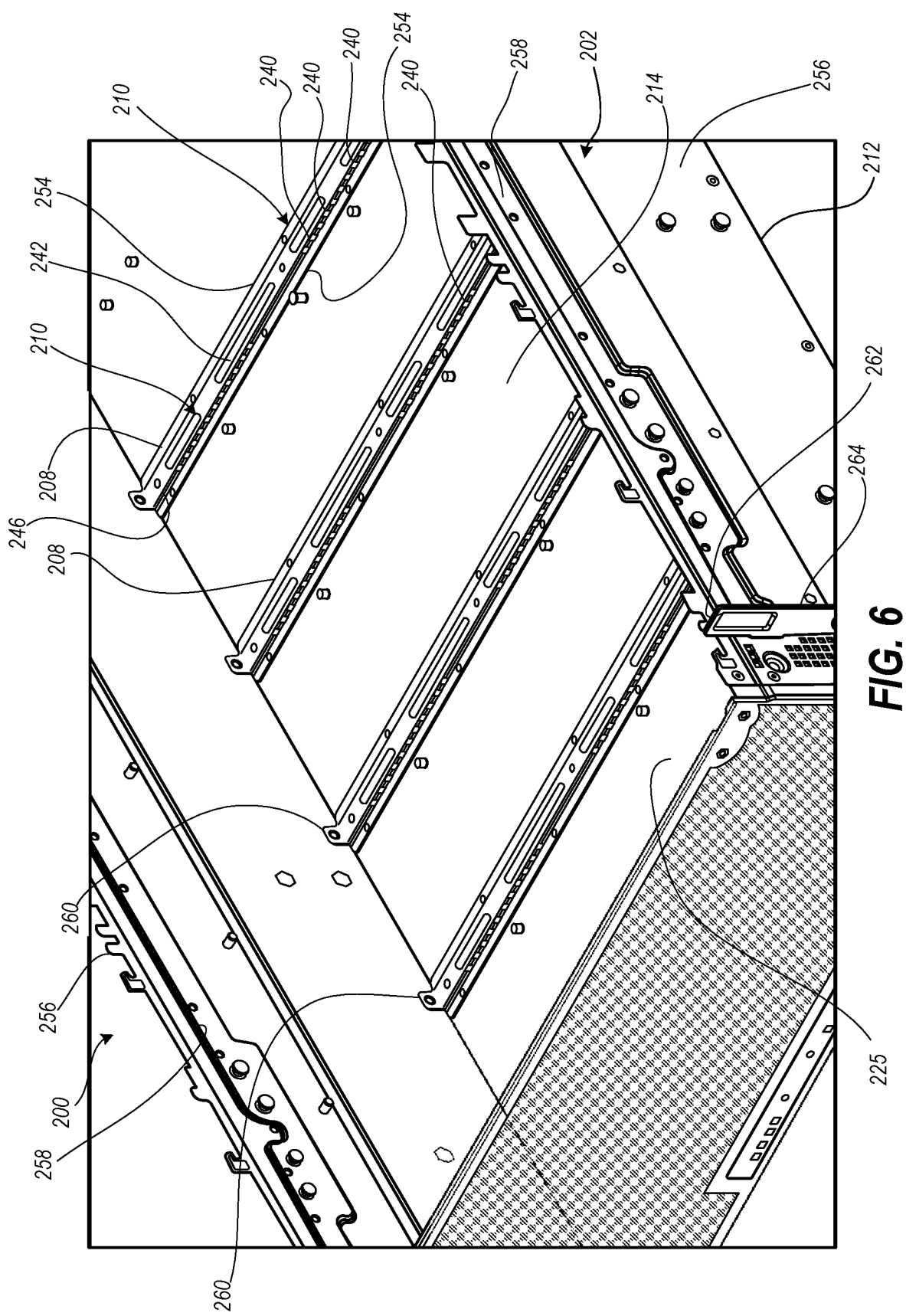
FIG. 6 illustrates a front left detail view of the chassis of FIG. 5, according to one or more embodiments.

FIGS. 4-11 illustrate an IHS 200 having an exemplary server chassis 202 with base stiffeners 208 that enhance cooling air flow, according to one or more embodiments. With particular reference to FIGS. 4-6, the base stiffeners 208 attach to a front area 225 of a base wall 214 of the enclosure 212. With particular reference to FIG. 6, each base stiffener 208 includes two (2) air channels 210 each formed from eleven (11) square apertures 240 through front and back blocking surfaces 246 on each planar member 242. It should be appreciated that the apertures 240 can be of different geometric shapes, sizes, numbers, and spacing to achieve a desired air flow. Each base stiffener 208 is attached to the base wall 214 of the enclosure 212 by fasteners that pass through forward and rearward chassis contacting flanges 254. Each lateral end of the base stiffener 208 includes an upward flared mounting tab 260 for mounting to a respective lateral wall 256 of the enclosure 212.

Figure 7:
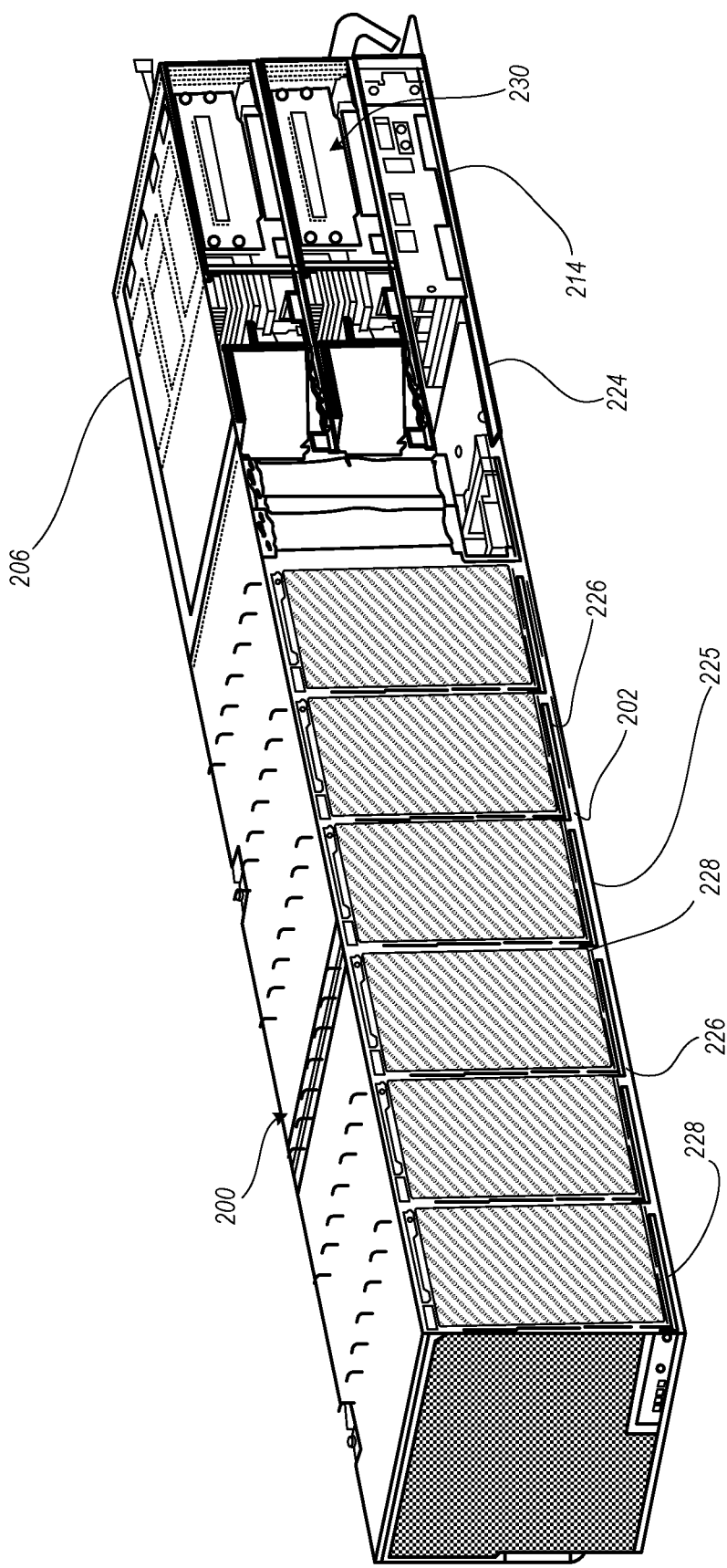
FIG. 7 illustrates a front left perspective view of an example IHS with the chassis of FIG. 4 partially cutaway to expose compute components supported by an example stiffener, according to one or more embodiments.
Figure 8:
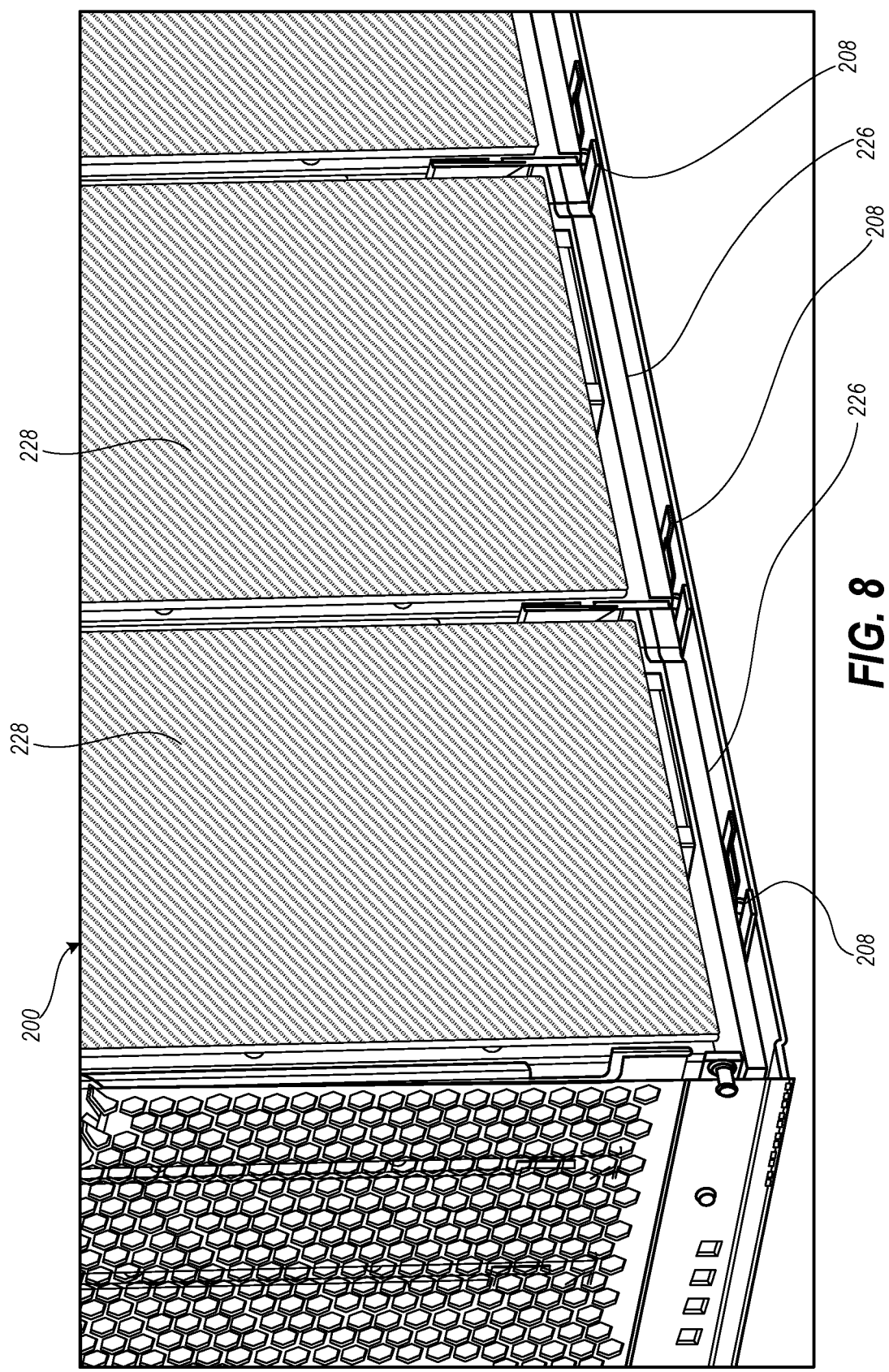
FIG. 8 illustrates a front left detail view of the example IHS of FIG. 7 partially cutaway to expose the compute components supported by the example stiffener, according to one or more embodiments.
Figure 9:
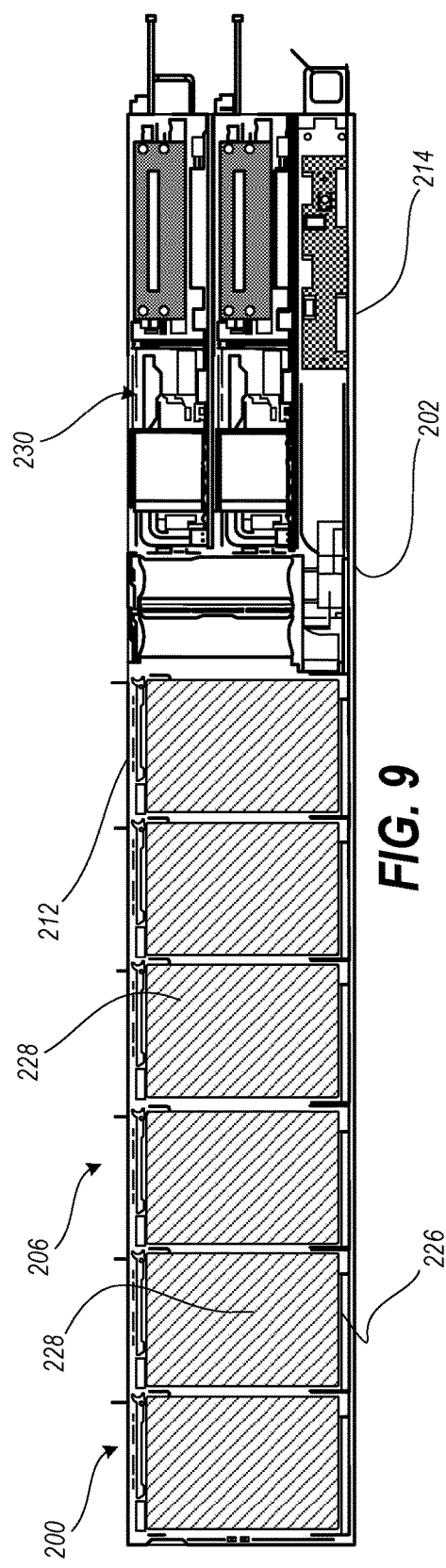
FIG. 9 illustrates a left side view of the example IHS of FIG. 7, according to one or more embodiments.

FIGS. 5-6 illustrate recessed air channels 258 formed into the lateral walls 256 of the enclosure 212. Cooling air enters an intake port 262 that is presented by a vertical bracket 264. The cooling air can bypass a rectoid space above the base stiffeners 208 to supplement the air channels 210. Cooling air can leave the recessed air channels 258 behind dense storage devices 228 (FIGS. 7-9). FIGS. 7-9 illustrate a functional server 206 of the IHS 200 having dense storage devices 228 that present impedance to air flow except through the air channels 210 and recessed air channels 258. Thermal energy generating components 230 in a rear area 224 of the enclosure 212 can be cooled by cooling air "snorkeled" around the dense storage devices 228.

Figure 10:
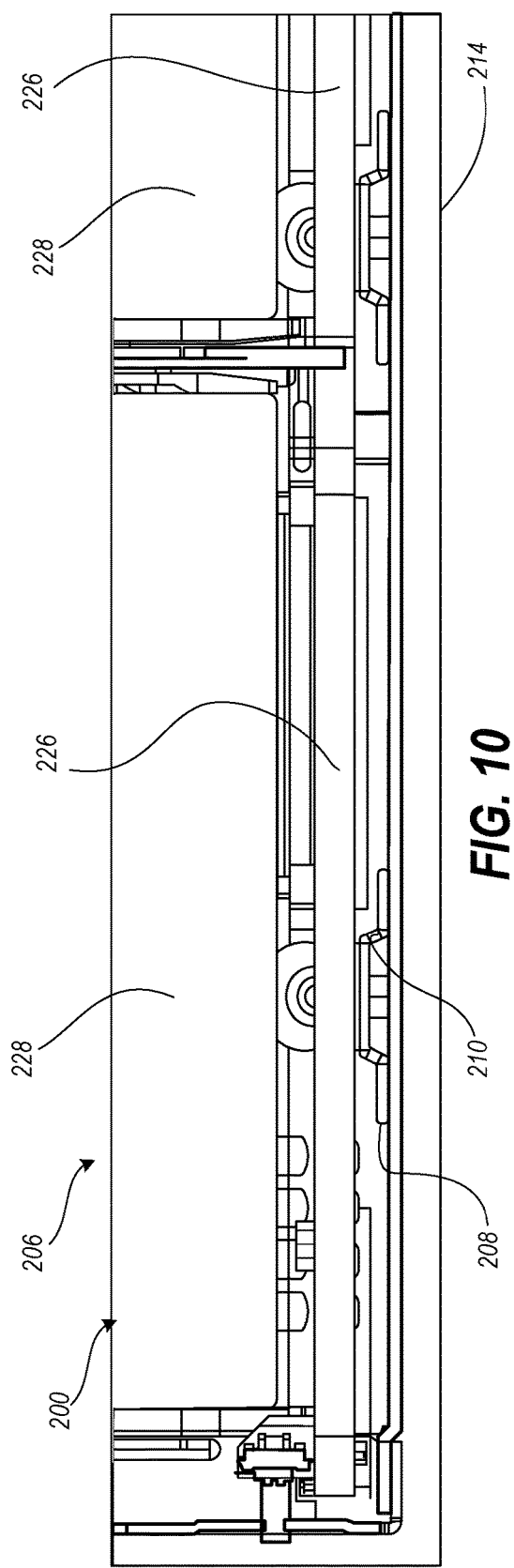
FIG. 10 illustrates a left detail view of the example IHS of FIG. 9, according to one or more embodiments.

FIG. 10 illustrates the functional server 206 having the air channels 210 that can cool the base stiffeners 208 and thus cool dense storage devices 228 that are indirectly mounted to the base stiffeners 208 via planar members 226. Thermally active components of storage devices such as hard disk drives (HDDs) can tend to be positioned in a lower portion of the respective storage device 228 for thermal conduction to a mounting surface such as the planar member 226.

Figure 11:
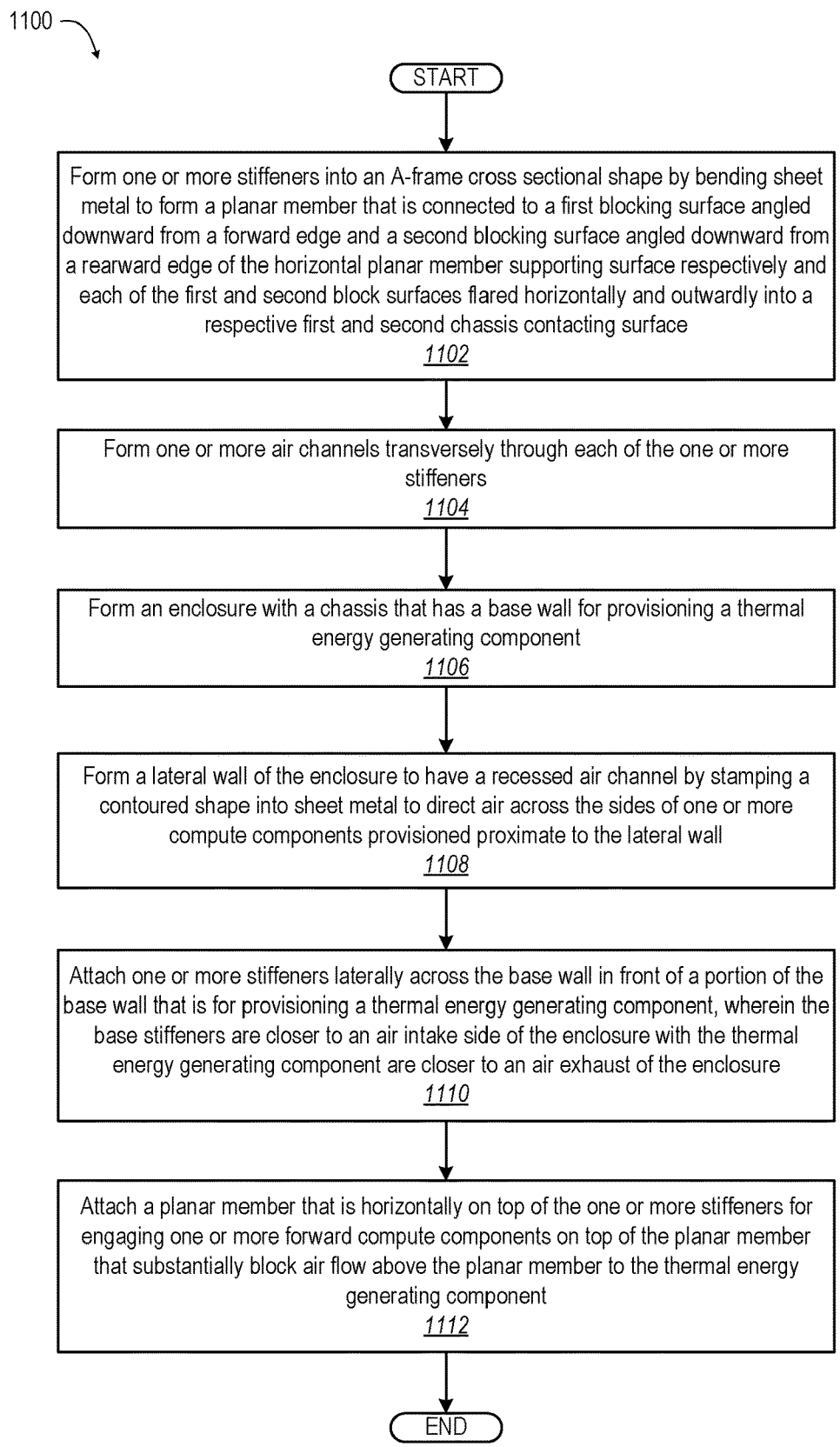
FIG. 11 illustrates a flow diagram of a method of manufacturing a chassis of an IHS having stiffeners that direct cooling air to a thermal energy generating component system that is thermally shadowed by compute components supported by the stiffeners, for a server chassis that is provisioned with serially aligned compute components, according to one or more embodiments.

FIG. 11 illustrates a method 1100 of manufacturing a chassis of an IHS having stiffeners that direct cooling air to one or more thermal energy generating component systems that is/are thermally shadowed by compute components supported by the stiffeners, according to one or more embodiments. The method 1100 begins at start block. The method 1100 includes forming one or more stiffeners each having one or more transverse air channels for directing air flow received proximate to the base wall. In one embodiment, the method 1100 includes forming the one or more stiffeners into an A-frame cross sectional shape by bending the sheet metal to form an elevated, substantially horizontal, planar member. A first blocking surface is angled downward from a forward edge of the planar member. A second blocking surface is angled downward from a rearward edge of the planar member. Each of the first and second blocking surfaces flare horizontally and outwardly into a respective first and second chassis contacting surface to facilitate attachment to the base wall (block 1102). The method 1100 includes forming one or more air channels transversely through each of the one or more stiffeners (block 1104). In the particular embodiment, the first and second blocking surfaces contain aligned air channels that are aligned front to back. In one embodiment, the method includes forming one or more apertures of one air channel to have an effective area that is greater than an effective area of one or more apertures of another air channel.

The method includes forming an enclosure with a chassis that has a base wall for provisioning a thermal energy generating component (block 1106). In one embodiment, the method 1100 includes forming a lateral wall of the enclosure to have a recessed air channel by stamping a contoured shape into sheet metal to direct air across the sides of one or more compute components provisioned proximate to the lateral wall (block 1108).

The method 1100 includes attaching one or more stiffeners laterally across the base wall in front of a portion of the base wall that is utilized for provisioning a thermal energy generating component (block 1110). The base stiffeners are placed closer to an air intake side of the enclosure, and the thermal energy generating components are closer to an air exhaust of the enclosure. The method 1100 includes attaching a planar member that is horizontally on top of the one or more stiffeners (block 1112). The planar member provides an upper surface for engaging one or more forward compute components that substantially block air flow above the planar member to the thermal energy generating component. Then method 1100 ends. With the chassis assembled, functional components of the IHS can be provisioned in the enclosure. When functionally interconnected, a fan or other air mover can cause cooling air to move through the enclosure, including through the air channels to cool a thermal energy generating component that is otherwise thermally shadowed.

In the above described flow chart of FIG. 11, one or more of the methods may be embodied in an automated manufacturing of an embedded ducting structure of a cooling system that performs a series of functional processes. In some implementations, certain steps of the method are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of manufacturing a chassis that cools thermal energy generating components of an information handling system (IHS), the method comprising:
   forming an enclosure with a chassis that has a base wall for provisioning a thermal energy generating component, the thermal energy generating component provision in a rear of the chassis;
   forming one or more stiffeners each having one or more air channels formed transversely through for directing air proximate to the base wall;
   attaching the one or more stiffeners laterally across the base wall at the bottom, forward section of the chassis; and
   attaching a planar member that is horizontally on top of the one or more stiffeners for engaging one or more forward compute components on top of the planar member, wherein the one or more forward compute components substantially block a flow of cooling air above the planar member to the thermal energy generating component;
   wherein the one or more air channels within the one or more stiffeners allow airflow to be channeled from a front of the chassis to the thermal energy generating component at the rear of the chassis, and the one or more air channels eliminate thermal shadowing caused by a placement of the one or more forward compute components in front of the thermal energy generating component provisioned in a rear area of the chassis.

2. The method of claim 1, wherein forming the one or more stiffeners further comprises:
   forming a planar member supporting surface, a base wall contacting surface, and a blocking surface that is connected between the planar member supporting surface and the base wall contacting surface and that blocks airflow through the chassis under the planar member; and
   forming the one or more air channels by forming one or more apertures through the blocking surface.

3. The method of claim 1, further comprising:
   provisioning the chassis with two or more thermal energy generating components; and
   forming one or more apertures of one air channel, the one or more apertures having an effective area that is greater than an effective area of one or more apertures of another air channel.

4. The method of claim 1, wherein forming the one or more stiffeners each further comprises:
   forming the one or more air channels into sheet metal; and
   bending the sheet metal to form a horizontal planar member supporting surface that is connected to a first blocking surface angled downward from a forward edge and a second blocking surface angled downward from a rearward edge of the horizontal planar member supporting surface respectively, each of the first and second blocking surfaces flaring horizontally and outwardly into a respective first and second chassis contacting surface, wherein the first and second blocking surfaces contain aligned one or more air channels.

5. The method of claim 4, wherein the bending the sheet metal further comprises stamping the sheet metal.

6. The method of claim 1, wherein forming the one or more stiffeners each further comprises molding the stiffener.

7. The method of claim 1, wherein forming the enclosure further comprises forming a recessed air channel in a lateral wall of the enclosure to direct air across sides of one or more compute components provisioned proximate to the lateral wall.

8. The method of claim 7, wherein forming the recessed air channel further comprises stamping a contoured shape into sheet metal.

9. A method for cooling components within an information handling system (IHS) comprising:
   providing a chassis that forms an enclosure having a base wall, with one or more stiffeners attached laterally across the base wall, and a planar member attached substantially horizontally on top of the one or more stiffeners;
   creating one or more air channels formed through each of the one or more stiffeners and which direct air flow under the planar member toward at least one thermal energy generating component, the one or more air channels eliminating thermal shadowing caused by placement of one or more forward compute components on top of the planner member and in front of at least one thermal energy generating component that is provisioned in a rear area of the chassis, wherein the one or more forward compute components substantially block a flow of cooling air above the planar member to the thermal energy generating component and the one or more air channels within the one or more stiffeners allow airflow to be channeled from a front of the chassis to the thermal energy generating component at a rear of the chassis.

10. The method of claim 1, wherein:
   each of the one or more stiffeners further comprise a planar member supporting surface, a base wall contacting surface, and a blocking surface that extends between the planar member supporting surface and the base wall contacting surface and that includes a solid surface that blocks airflow through the chassis under the planar member; and
   one or more apertures that are formed within the solid surface provide the one or more air channels.

11. The method of claim 10, wherein the one or more stiffeners each further comprises a rectangular sheet metal bent to form a horizontal planar member supporting surface that is connected to a first blocking surface angled downward from a forward edge and a second blocking surface angled downward from a rearward edge of the horizontal planar member supporting surface, respectively, each of the first and second blocking surfaces flaring horizontally and outwardly into a respective one of a first and a second chassis contacting surface.

12. The method of claim 10, wherein the one or more stiffeners comprise a molded component.

13. The method of claim 9, wherein the enclosure of the chassis further comprises a lateral wall that is attached to the base wall and that comprises a recessed air channel to direct air across sides of the one or more compute components provisioned proximate to the lateral wall.

14. The method of claim 9, wherein:
   at least one thermal energy generating component is provisioned within the enclosure of the chassis towards a rear area of the planar member; and
   one or more compute components are engaged on top of the planar member and substantially block air flow above the planar member.

* * * * *